(12) United States Patent
Wang et al.

(10) Patent No.: US 9,196,634 B2
(45) Date of Patent: Nov. 24, 2015

(54) TFT ARRAY SUBSTRATE, DISPLAY PANEL AND DISPLAY DEVICE

(71) Applicants: Shanghai AVIC Optoelectronics Co., Ltd., Shanghai (CN); Tianma Micro-Electronics Co., Ltd., Shenzhen (CN)

(72) Inventors: Zheng Wang, Shanghai (CN); Zhaokeng Cao, Shanghai (CN); Yao Lin, Shanghai (CN); Longcai Xin, Shanghai (CN)

(73) Assignees: Shanghai AVIC Optoelectronics Co., Ltd., Shanghai (CN); Tianma Micro-Electronics Co., Ltd., Shenzhen (CN)

(*) Notice: Subject to any disclaimer, the term of this patent is extended or adjusted under 35 U.S.C. 154(b) by 56 days.

(21) Appl. No.: 14/228,210

(22) Filed: Mar. 27, 2014

(65) Prior Publication Data

US 2015/0137130 A1 May 21, 2015

(30) Foreign Application Priority Data

Nov. 15, 2013 (CN) .......................... 2013 1 0573642

(51) Int. Cl.
G02F 1/1343 (2006.01)
H01L 27/12 (2006.01)
G02F 1/1362 (2006.01)

(52) U.S. Cl.
CPC ........ *H01L 27/124* (2013.01); *G02F 1/134336* (2013.01); *G02F 1/136286* (2013.01)

(58) Field of Classification Search
USPC ......................................................... 349/141
See application file for complete search history.

(56) References Cited

FOREIGN PATENT DOCUMENTS

CN 200810008152 A 8/2008
KR 1020100122404 A 6/2012

*Primary Examiner* — Lucy Chien
(74) *Attorney, Agent, or Firm* — Alston & Bird LLP

(57) ABSTRACT

The present invention discloses a TFT array substrate, comprising: a plurality of scan lines; a plurality of data lines; pixel units located in areas defined by adjacent scan lines and adjacent data lines; wherein each of the pixel units comprises a first electrode and a second electrode stacked and insulated from each other, the first electrode is flat shape, and the second electrode comprises a plurality of strip electrodes extending along a first direction and arranged along a second direction; a first pixel unit and a second pixel unit adjacent to each other form a unit group; the first pixel unit comprises a first part extending along the first direction and a second part extending from an end area of the first part to the second pixel unit; the second pixel unit comprises a third part extending along the first direction and a fourth part extending from an end area of the third part to the first pixel unit; and the second part is staggered with the fourth part. With such design, the color resistance compensation can not be needed, and also the transmittance is increased.

20 Claims, 9 Drawing Sheets

TFT ARRAY SUBSTRATE, DISPLAY PANEL AND DISPLAY DEVICE

CROSS-REFERENCES TO RELATED APPLICATIONS

This application claims the benefit of priority to Chinese Patent Application No. 201310573642.6, filed with the Chinese Patent Office on Nov. 15, 2013 and entitled "TFT ARRAY SUBSTRATE, DISPLAY PANEL AND DISPLAY DEVICE", the content of which is incorporated herein by reference in its entirety.

TECHNICAL FIELD

The present invention relates to the field of flat panel displays, and particularly to a TFT array substrate, a display panel and a display device including the TFT array substrate.

BACKGROUND OF THE INVENTION

Flat panel displays are welcomed by people due to their advantages of lightness, thinness, power saving and the like, wherein liquid crystal display panels are most common. The liquid crystal display panels mainly include the following types according to working modes of liquid crystals: TN (Twisted Nematic) type, IPS (In-plane Switching) type, FFS (Fringe Field Switching) type and the like. The FFS liquid crystal display technology is proved to be a good liquid crystal display mode used for high resolution and wide viewing angle, and characteristics of this mode exceed those of a horizontal electric field driving IPS mode in the same type, because the number of liquid crystal domains can be freely designed to be even or odd in fringe field display, and this kind of design gets rid of the limitation that the number of liquid crystal domains in the horizontal electric field driving IPS mode is even, and thus has an excellent display effect for high-resolution liquid crystal display.

FIG. 1 is a top view of a structure of pixels of an FFS-type liquid crystal display panel in the prior art, and FIG. 2 is a cross-section view of the structure in FIG. 1 along AA'. It can be seen from FIGS. 1 and 2 that the FFS-type liquid crystal display panel includes: a plurality of scan lines 101; a plurality of data lines 102 insulated from and intersecting (generally perpendicularly intersecting) the scan lines 101; and pixel units located in pixel areas (shown by the dashed box in the figure) defined by adjacent scan lines 101 and adjacent data lines 102. Each pixel unit includes a common electrode 104 and a pixel electrode 105 stacked and insulated from each other. The common electrode 104 is flat shape; and the pixel electrode 105 is comb-like shape and includes a plurality of strip electrodes. The pixel unit further includes a TFT (Thin Film Transistor) 103 arranged near the intersection of the scan line 101 with the data line 102, where the gate electrode of the TFT 103 is electrically connected with the scan line 101, the source (or drain) electrode of the TFT 103 is electrically connected with the data line 102, and the drain (or source) electrode of the TFT 103 is electrically connected with the pixel electrode 105. In the pixel structure shown in FIGS. 1 and 2, the pixel electrode 105, the common electrode 104 and the data line 102 are insulated from each other, but for brevity, insulating layers arranged between any two of them are not drawn in the figures. In addition, in the pixel structure shown in FIGS. 1 and 2, the pixel electrode 105 is located above the common electrode 104. The pixel structure further includes a shielding electrode 106 extending from the flat shaped common electrode 104 and covering the data lines 102.

FIG. 3 is a top view of a structure of pixels of another FFS-type liquid crystal display panel in the prior art, and FIG. 4 is a cross-section view of the structure in FIG. 3 along BB'. Similarities between the pixel structure shown in FIGS. 3 and 4 and the pixel structure shown in FIGS. 1 and 2 are not repeated, and differences between them are mainly described. It can be seen from FIGS. 3 and 4 that the common electrode 104 is comb-like shape and includes a plurality of strip electrodes; and the pixel electrode 105 is flat shape. The common electrode 104 is located above the pixel electrode 105. The pixel structure further includes a shielding electrode 106 extending from the comb-like shaped common electrode 104 and covering the data lines 102.

In the pixel structures of the two above-mentioned FFS-type liquid crystal display panels in the prior art, all the pixels are identical in shape and size, which brings difficulty in the design of small-size panels with high-resolution pixels. Specifically, due to the resolution limitation of an exposure machine, there would be minimum design requirements on the widths (namely line widths) of strip electrodes (common electrode, shielding electrode and pixel electrode) and on the spacing (line distance) of slits between the strip electrodes, so that the selection of the number of liquid crystal domains in a pixel in the actual FFS-type liquid crystal display panel is limited. For example, PPI (Pixel Per Inch) of a 5.3 HD (High Definition) product reaches about 280, and each pixel can only include 3 slits at most. If a design that each pixel has more than 3 slits, such as 4 slits, is selected, then the line width and the line distance will exceed the resolution limitation of the exposure machine. In the pixel design of 3 slits, due to the overlarge spacing (line distance) of the slits, the transmittance is reduced; and if a design that each pixel has less than 3 slits is further adopted, then the spacing (line distance) of the slits is further increased, and thus the transmittance will further be reduced.

To solve the above-mentioned problem in the prior art that the number of slits or the number of liquid crystal domains is limited in the FFS pixel design, a pixel structure of a third FFS-type liquid crystal display panel is provided in the prior art, which is shown in FIGS. 5 and 6. FIG. 5 is a top view of a structure of pixels of the third FFS-type liquid crystal display panel in the prior art, and FIG. 6 is a cross-section view of the structure in FIG. 5 along CC'. Similarities between the pixel structure shown in FIGS. 5 and 6 and the pixel structure shown in FIGS. 1 and 2 are not repeated, and differences between them are mainly described. It can be seen from FIGS. 5 and 6 that pixels are different in size due to different numbers of slits in adjacent pixel units; and the two adjacent pixel units have an odd number of strip electrodes and slits in the width direction. Specifically, pixel units 11 and 12 are adjacent, three strip electrodes and two slits are arranged in the pixel unit 11, and four strip electrodes and three slits are arranged in the pixel unit 12; and the width of the pixel unit 12 is greater than that of the pixel unit 11 (the width direction is perpendicular to the extending direction of the strip electrodes).

BRIEF SUMMARY OF THE INVENTION

To solve the technical problems in the prior art, an embodiment of the present invention provides a TFT array substrate, including: a plurality of scan lines; a plurality of data lines insulated from and intersecting the plurality of scan lines; pixel units located in pixel areas defined by adjacent scan lines and adjacent data lines; wherein each of the pixel units comprises a first electrode and a second electrode stacked and insulated from each other, the first electrode is flat shape, and the second electrode comprises a plurality of strip electrodes extending along a first direction and arranged along a second direction; a first pixel unit and a second pixel unit adjacent to each other form a unit group; the first pixel unit comprises a first part extending along the first direction and a second part extending from an end area of the first part to the second pixel unit; the second pixel unit comprises a third part extending along the first direction and a fourth part extending from an end area of the third part to the first pixel unit; and the second part is staggered with the fourth part.

Embodiments of the present invention further provide a display panel and a display device including the above-mentioned TFT array substrate.

DETAILED DESCRIPTION OF THE PREFERRED EMBODIMENTS

The core idea of the present invention is that respective pixel units are equal in size and color resistance compensation is not needed by designing the shape of pixel units and the arrangement of the TFT array; and a unit group formed by two adjacent pixel units can be provided with an odd number of strip electrodes and slits in the width direction, so that the transmittance is increased.

Specifically, the shape of the pixel units and the arrangement of the TFT array are as follows: a first pixel unit and a second pixel unit adjacent to each other form a unit group; the first pixel unit includes a first part extending along a first direction (the extending direction of strip electrodes) and a second part extending from an end area of the first part to the second pixel unit; the second pixel unit includes a third part extending along the first direction and a fourth part extending from an end area of the third part to the first pixel unit; and the second part is staggered with the fourth part.

An Embodiment

Figure 7:
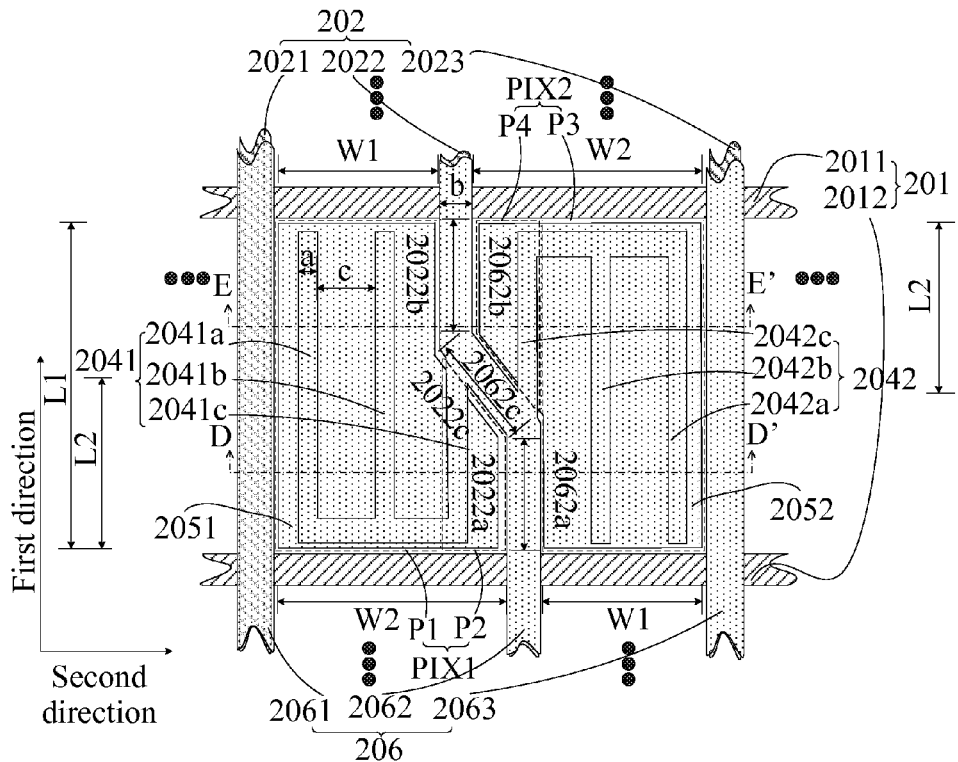
FIG. 7 is a top view of a structure of pixels in a TFT array substrate according to an embodiment of the present invention.
Figure 8:
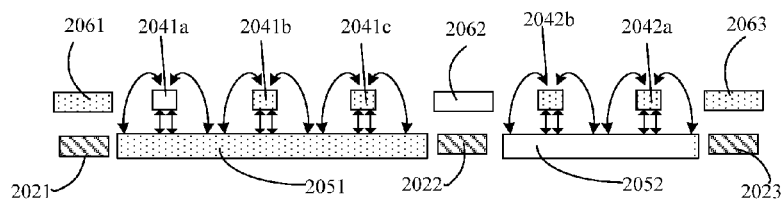
FIG. 8 is a cross-section view of the structure in FIG. 7 along DD'.
Figure 9:
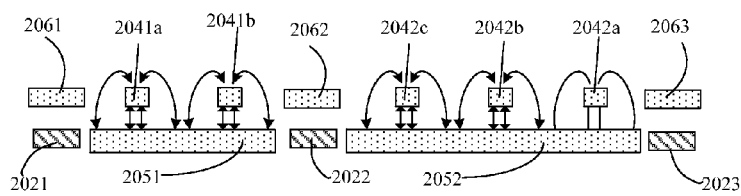
FIG. 9 is a cross-section view of the structure in FIG. 7 along EE'.

A top view of a structure of pixels in a TFT array substrate according to an embodiment of the present invention is shown in FIG. 7 (FIG. 7 only shows a partial structure of two adjacent pixel units), FIG. 8 is a cross-section view of the structure in FIG. 7 along DD', and FIG. 9 is a cross-section view of the structure in FIG. 7 along EE'. It can be seen from FIGS. 7, 8 and 9 that the TFT array substrate according to the embodiment includes:

a plurality of scan lines 201 (two adjacent scan lines 2011 and 2012 are shown in the figure);

a plurality of data lines 202 (three adjacent data lines 2021, 2022 and 2023 are shown in the figure) insulated from and intersecting the plurality of scan lines 201; and pixel units (two adjacent pixel units PIX1 and PIX2 are shown in the figure) located in pixel areas defined by adjacent scan lines and adjacent data lines.

In this case, each of the pixel units includes a first electrode and a second electrode stacked and insulated from each other, the first electrode is flat shape, and the second electrode includes a plurality of strip electrodes extending along a first direction and arranged along a second direction (the first direction intersects the second direction, and is generally perpendicular to or substantially perpendicular to the second direction). Specifically, the pixel unit PIX1 includes a first electrode 2051 and a second electrode 2041 stacked and insulated from each other, the first electrode 2051 is flat shape, and the second electrode 2041 includes a plurality of strip electrodes 2041a, 2041b and 2041c (three strip electrodes as an example in the figure) extending along the first direction and arranged along the second direction; and the pixel unit PIX2 includes a first electrode 2052 and a second electrode 2042 stacked and insulated from each other, the first electrode 2052 is flat shape, and the second electrode 2042 includes a plurality of strip electrodes 2042a, 2042b and 2042c (three strip electrodes as an example in the figure) extending along the first direction and arranged along the second direction.

The adjacent first pixel unit PIX1 and second pixel unit PIX2 form a unit group, and are arranged along the second direction; the first pixel unit PIX1 includes a first part P1 extending along the first direction and a second part P2 extending from an end (a lower end in the figure) area of the first part P1 to the second pixel unit PIX2; the second pixel unit PIX2 includes a third part P3 extending along the first direction and a fourth part P4 extending from an end (an upper end in the figure) area of the third part P3 to the first pixel unit PIX1; and the second part P2 is staggered with the fourth part P4 (for example, the second part P2 and the fourth part P4 are arranged along the first direction, as shown in FIG. 7). The first part P1 can be in one of a plurality of shapes, such as in shape of a parallelogram, an epaulet, a rectangle or a square and the like. Generally, the width of the first part P1 along the first direction remains unchanged or substantially unchanged. Taking the rectangular first part P1 as an example in FIG. 7, the length L1 of the first part P1 in the first direction is greater than the width W1 in the second direction. Similarly, the third part P3 can be in one of a plurality of shapes, such as in shape of a parallelogram, an epaulet, a rectangle or a square and the like. Generally, the width of the third part P3 along the first direction remains unchanged or substantially unchanged. Taking the rectangular third part P3 as an example in FIG. 7, the length L1 of the third part P3 in the first direction is greater than the width W1 in the second direction. Optionally, the first part P1 and the third part P3 are the same or substantially same in shape, and are arranged in parallel (both are rectangular as shown in the figure).

In addition, in FIG. 7, the second part P2 extends from the lower end of the first part P1 to the second pixel unit PIX2 along the second direction, so that the width of the lower end (namely the end where the second part P2 is located) of the first pixel unit PIX1 in the width direction (namely the second direction) is W2; and the fourth part P4 extends from the upper end of the third part P3 to the first pixel unit PIX1 along the second direction, so that the width of the upper end (namely the end where the fourth part P4 is located) of the second pixel unit PIX2 in the width direction (namely the second direction) is W2. The upper end and the lower end are two opposite ends of the unit group respectively. The length L2 of the second part P2 in the first direction is smaller than the length L1 of the first part P1 in the first direction; and similarly, the length L2 of the fourth part P4 in the first direction is smaller than the length L1 of the third part P3 in the first direction. The second part P2 and the fourth part P4 extend along the opposite directions and are staggered with each other, so that they are arranged along the first direction. The first part P1 and the second part P2 form an L shape, the third part P3 and the fourth part P4 form an L shape, and the interior angle of the L shape of the first pixel unit PIX1 and the interior angle of the L shape of the second pixel unit PIX2 are in a diagonal arrangement.

It should be noted that if the first part P1 and the third part P3 are designed to be in different shapes, the unit group formed by the first pixel unit PIX1 and the second pixel unit PIX2 can also be in different shapes, such as in shape of a parallelogram, an epaulet, a rectangle or a square and the like. In FIG. 7, since both the first part P1 and the third part P3 are rectangular, the whole unit group is also rectangular. The length of the unit group along the first direction is L1 (not including the width of the scan line 201), and the width W of the unit group along the second direction is the sum of W1, W2 and the width of the data line 202. In this case, the profile of the first pixel unit PIX1 and the profile of the second pixel unit PIX2 are centrosymmetric.

Figure 10:
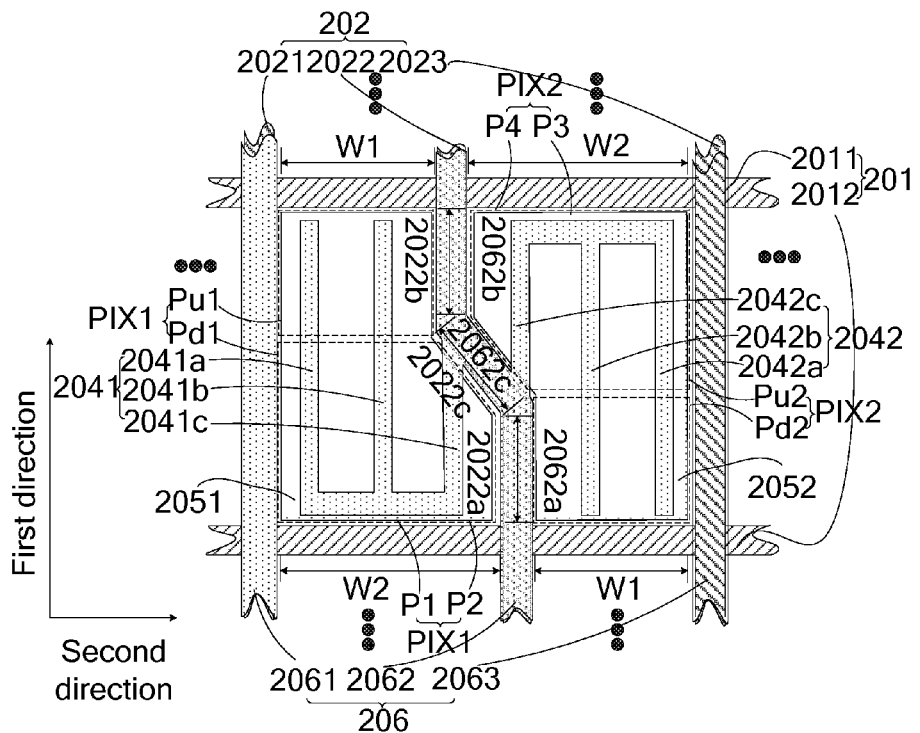
FIG. 10 is another top view of the structure of the pixels in the TFT array substrate according to an embodiment of the present invention.

The embodiment is described from another perspective, as shown in FIG. 10. Each of the first pixel unit PIX1 and the second pixel unit PIX2 includes a wide part and a narrow part; that is, the first pixel unit PIX1 includes a wide part Pd1 and a narrow part Pu1 arranged along the first direction, and the second pixel unit PIX2 includes a wide part Pu2 and a narrow part Pd2 arranged along the first direction. The wide part Pd1 is the lower end of the first pixel unit PIX1, namely the end where the second part P2 is located, and has a width W2 (the sum of the widths of the first part P1 and the second part P2); and the narrow part Pu1 is the upper end of the first pixel unit PIX1, and has a width W1. The wide part Pu2 is the upper end of the second pixel unit PIX2, namely the end where the fourth part P4 is located, and has a width W2 (the sum of the widths of the third part P3 and the fourth part P4); and the narrow part Pd2 is the lower end of the second pixel unit PIX2, and has a width W1.

The wide part Pd1 of the first pixel unit PIX1 and the narrow part Pd2 of the second pixel unit PIX2 are arranged to match with each other correspondingly, namely they are arranged along the second direction at the lower end; and the wide part Pu2 of the second pixel unit PIX2 and the narrow part Pu1 of the first pixel unit PIX1 are arranged to match with each other correspondingly, namely they are arranged along the second direction at the upper end. Preferably, the first pixel unit PIX1 and the second pixel unit PIX2 are equal or substantially equal in size, and are the same or substantially same in area. Further, the storage capacitance of the first pixel unit PIX1 and the storage capacitance of the second pixel unit PIX2 are the same or substantially same is size (at this time, flicker can be well suppressed), or the overlapping area of the first electrode 2051 with the second electrode 2041 of the first pixel unit PIX1 and the overlapping area of the first electrode 2052 with the second electrode 2042 of the second pixel unit PIX2 are the same or substantially same, and in this case, the color resistance compensation is not needed for the first pixel unit PIX1 and the second pixel unit PIX2 during display. In addition, the first pixel unit PIX1 and the second pixel unit PIX2 can also be the same in shape.

It can further be seen from FIGS. 7, 8 and 9 that the second part P2 is provided with one strip electrode 2041c; and the fourth part P4 is provided with one strip electrode 2042c. Each of the first part P1 and the third part P3 includes N strip electrodes, where N is a natural number larger than or equal to 0. In FIG. 7, N=2 is taken as an example, namely the first part P1 is provided with two strip electrodes 2041a and 2041b, and the third part P3 is provided with two strip electrodes 2042a and 2042b. Generally, N is one of 0, 1, 2, 3 and 4. In this case, the end (namely the lower end) of the unit group corresponding to the second part P2 is provided with (2N+1) strip electrodes, and the end (namely the upper end) of the unit group corresponding to the fourth part P4 is provided with (2N+1) strip electrodes; that is, the unit group has an odd number of strip electrodes in the width direction (second direction).

In addition, in the embodiment, the first electrodes 2051 and 2052 are pixel electrodes, and the second electrodes 2041 and 2042 are common electrodes and are located above the pixel electrodes 2051 and 2052. The TFT array substrate further includes a shielding electrode 206. The shielding electrode 206 is generally located on the same layer and made of the same material as the common electrodes 2041 and 2042, and generally also has a common potential. In the embodiment, the shielding electrode 206 includes a first shielding electrode 2061 and a third shielding electrode 2063 respectively located above the data lines 2021 and 2023 outside the first pixel unit PIX1 and the second pixel unit PIX2 and insulated from and overlapping with the data lines 2021 and 2023. Generally, the first shielding electrode 2061 covers the data line 2021, and the third shielding electrode 2063 covers the data line 2023. The shielding electrode 206 further includes a second shielding electrode 2062, which is formed by extending the strip electrodes of the common electrodes 2041 and 2042 to a position above the data line 2022 between the first pixel unit PIX1 and the second pixel unit PIX2 and is insulated from and overlaps with the data line 2022. Generally, the second shielding electrode 2062 covers the data line 2022. Specifically, the second shielding electrode 2062 is formed by extending the strip electrode 2041c of the second part P2 and the strip electrode 2042c of the fourth part P4 to the position above the data line 2022 between the first pixel unit PIX1 and the second pixel unit PIX2. Certainly, the second shielding electrode 2062 can also be formed by extending the strip electrode 2041c of the second part P2 or the strip electrode 2042c of the fourth part P4 to the position above the data line 2022 between the first pixel unit PIX1 and the second pixel unit PIX2. The data line 2022 between the first pixel unit PIX1 and the second pixel unit PIX2 includes a first section 2022a between the second part P2 and the third part P3, a second section 2022b between the fourth part P4 and the first part P1, and a third section 2022c between the second part P2 and the fourth part P4; where both the first section 2022a and the second section 2022b are along the first direction, and the third section 2022c is located between the first section 2022a and the second section 2022b and connected with the first section 2022a and the second section 2022b. Correspondingly, as a preferred mode, the strip electrode 2042c of the fourth part P4 extends to a position above the first section 2022a along the first direction to form a first section 2062a of the second shielding electrode 2062, and the strip electrode 2041c of the second part P2 extends to a position above the second section 2022b along the first direction to form a second section 2062b of the second shielding electrode 2062. In addition, the second shielding electrode 2062 further includes a third section 2062c connected with the first section 2062a and the second section 2062b, and covers the third section 2022c of the data line 2022.

Further referring to FIGS. 7, 8 and 9, it is assumed that the width of each of the strip electrodes 2041a, 2041b, 2041c, 2042a, 2042b and 2042c is a; the width of each of the shielding electrodes 2061, 2062 and 2063 is b; there are slits with a width of c between adjacent strip electrodes and between adjacent strip electrodes and shielding electrodes, that is, there are slits with the width of c between 2041a and 2041b, between 2041b and 2041c, between 2041c and 2062, between 2062 and 2042c, between 2042c and 2042b, and between 2042b and 2042a; the unit group has (2N+1) strip electrodes, two shielding electrodes 2062 and 2063 (or 2061), and (2N+3) slits in the second direction; and in this case, the width W of the unit group is $(2N+1)*a+(2N+3)*c+2b$, and the average width of one pixel unit is $W'=W/2=(N+0.5)*a+(N+1.5)*c+b$. In consideration of the limitation of process conditions (particularly exposure limit of the exposure machine) for preparing the TFT array substrate, a, b and c cannot be too small; and in consideration of the transmittance of the TFT array substrate, a, b and c cannot be too large.

By comparing the prior art shown in FIGS. 3 and 4 with the solution according to the embodiment of the present invention, beneficial effects of the embodiment of the present invention will be described below.

It is assumed that a, b and c have minimums $a_{min}$, $b_{min}$ and $c_{min}$ respectively, and maximums $a_{max}$, $b_{max}$ and $c_{max}$ respectively; i.e., $a_{min} \leq a \leq a_{max}$, $b_{min} \leq b \leq b_{max}$, and $c_{min} \leq c \leq c_{max}$.

Figure 3:
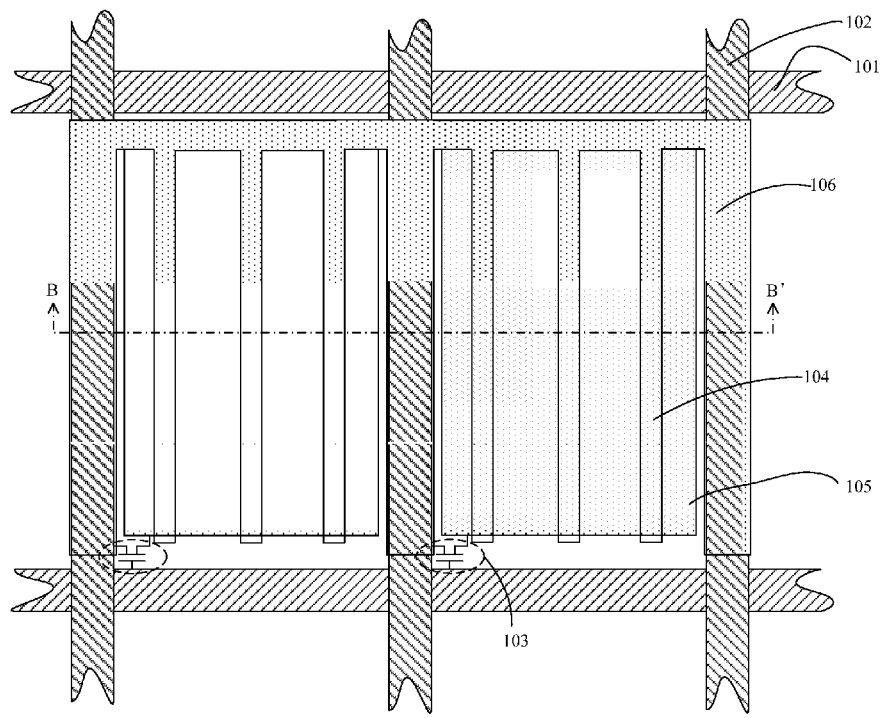
FIG. 3 is a top view of a structure of pixels of another FFS-type liquid crystal display panel in the prior art.
Figure 4:
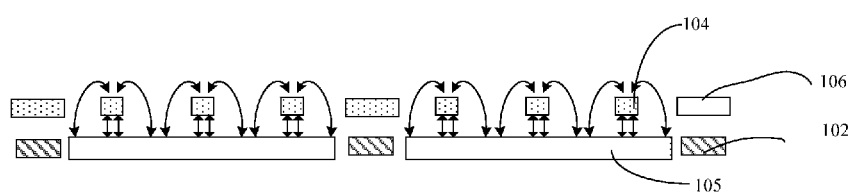
FIG. 4 is a cross-section view of the structure in FIG. 3 along BB'.
Figure 5:
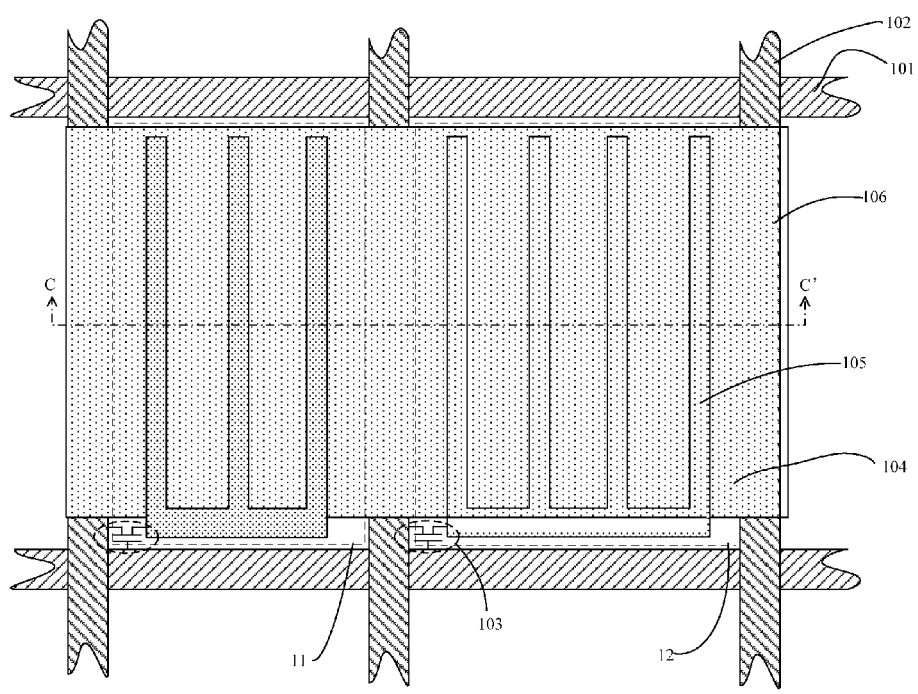
FIG. 5 is a top view of a structure of pixels of a third FFS-type liquid crystal display panel in the prior art.
Figure 6:
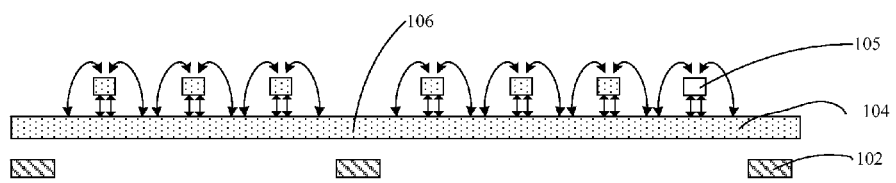
FIG. 6 is a cross-section view of the structure in FIG. 5 along CC'.

According to the prior art shown in FIGS. 3 and 4, if the width of each pixel unit is $W'=N*a+(N+1)*c+b$, the width W' of each pixel unit satisfies $N*a_{min}+(N+1)*c_{min}+b_{min} \leq W' \leq N*a_{max}+(N+1)*c_{max}+b_{max}$. Since N is a natural number larger than or equal to 0, the width W' of each pixel unit is limited in the prior art, and pixel units with some widths cannot be realized or are realized with poor effects by using the prior art shown in FIGS. 3 and 4. For example, for a pixel unit with a width W', if the width W' satisfies $N*a_{max}+(N+1)*c_{max}+b_{max}<W'<(N+1)*a_{min}+(N+2)*c_{min}+b_{min}$, the pixel unit cannot be realized or is realized with poor effects by using the prior art shown in FIGS. 3 and 4, because if $W'<(N+1)*a_{min}+(N+2)*c_{min}+b_{min}$, (N+1) strip electrodes cannot be prepared in the pixel unit under the exposure limit of the exposure machine; and if $N*a_{max}+(N+1)*c_{max}+b_{max}<W'$, N strip electrodes can be arranged in the pixel unit, but the transmittance is too low. On the other hand, the average width of one pixel unit in the embodiment of the present invention is $W=(N+0.5)*a+(N+1.5)*c+b$ and satisfies $(N+0.5)*a_{min}+(N+1.5)*c_{min}+b_{min} \leq W \leq (N+0.5)*a_{max}+(N+1.5)*c_{max}+b_{max}$. As long as the value range $(N+0.5)*a_{min}+(N+1.5)*c_{min}+b_{min} \leq W \leq (N+0.5)*a_{max}+(N+1.5)*c_{max}+b_{max}$ of the average width W of one pixel unit in the embodiment of the present invention and $N*a_{max}+(N+1)*c_{max}+b_{max}<W'<(N+1)*a_{min}+(N+2)*c_{min}+b_{min}$ have an intersection, the pixel units prepared in the embodiment of the present invention can not only meet the exposure limit requirement of the exposure machine, but also have relatively high transmittance.

A specific example is further given below for illustration. Generally, let 2 µm≤a≤3 µm (a preferred value of a is 2.5 µm), 8.5 µm≤b≤9.5 µm, and 4 µm≤c≤5 µm (a preferred value of c is 4.5 µm); namely $a_{min}$ 2 µm, $b_{min}$=8.5 µm, $c_{min}$=4 µm, $a_{max}$=3 µm, $b_{max}$=9.5 µm, and $c_{max}$ 5 µm. At this time, the width W' of the pixel unit prepared by using the prior art shown in FIGS. 3 and 4 satisfies 2N µm+4(N+1) µm+8.5 µm≤W'≤3N µm+5(N+1) µm+9.5 µm, that is, W' satisfies 12.5 µm≤W'≤14.5 µm (N=0) or 18.5 µm≤W'≤22.5 µm (N=1) or 24.5 µm≤W'≤30.5 µm (N=2) or 30.5 µm≤W'≤38.5 µm (N=3). Correspondingly, for the pixel unit of which the width W' satisfies 14.5 µm≤W'≤18.5 µm, 0 strip electrode can merely be arranged in one pixel unit in the prior art shown in FIGS. 3 and 4, and at this time, the transmittance is low. For the pixel unit of which the width W' satisfies 22.5 µm<W'<24.5 µm, 1 or 0 strip electrode can merely be arranged in one pixel unit in the prior art shown in FIGS. 3 and 4, but the transmittance is also low. On the other hand, the average width of one pixel unit in the embodiment of the present invention is $W=(N+0.5)*a+(N+1.5)*c+b$ and satisfies 2(N+0.5) µm+4(N+1.5) µm+8.5 µm≤W≤3(N+0.5) µm+5(N+1.5) µm+9.5 µm, that is, W satisfies 15.5 µm≤W≤18.5 µm (N=0) or 21.5 µm≤W≤26.5 µm (N=1) or 27.5 µm≤W≤34.5 µm (N=2) or 33.5 µm≤W≤42.5 µm (N=3). 15.5 µm≤W≤18.5 µm (N=0) and 14.5 µm<W'<18.5 µm have an intersection 15.5 µm≤W≤18.5 µm, that is, for the pixel unit of which the width W satisfies 15.5 µm≤W<18.5 µm, 0 strip electrode can be arranged in one pixel unit in the embodiment of the present invention, and at this time, the exposure limit requirement of the exposure machine can be met, and relatively high transmittance can also be obtained. Similarly, 21.5 µm≤W≤26.5 µm (N=1) and 22.5 µm<W'<24.5 µm have an intersection 22.5 µm<W'<24.5 µm, that is, for the pixel unit of which the width W satisfies 22.5 µm<W<24.5 µm, 1 strip electrode can be arranged in one pixel unit in the embodiment of the present invention, and at this time, the exposure limit requirement of the exposure machine can be met, and relatively high transmittance can also be obtained.

Another Embodiment

Figure 11:
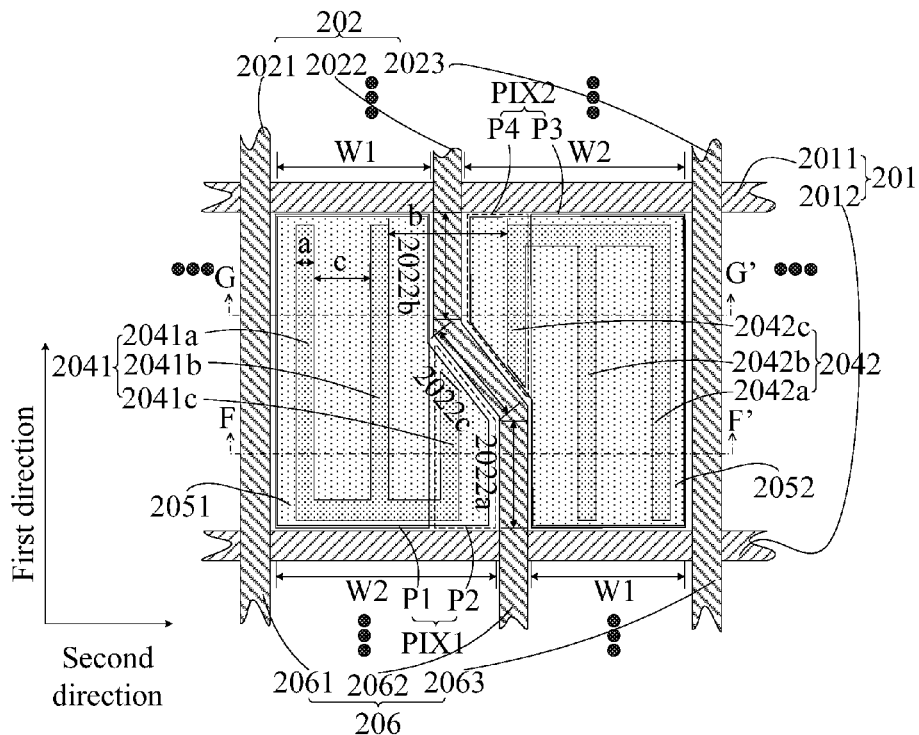
FIG. 11 is a top view of a structure of pixels in a TFT array substrate according to another embodiment of the present invention.
Figure 12:
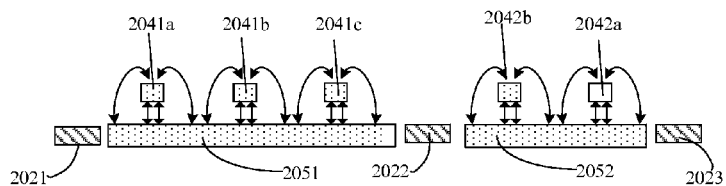
FIG. 12 is a cross-section view of the structure in FIG. 11 along FF'.
Figure 13:
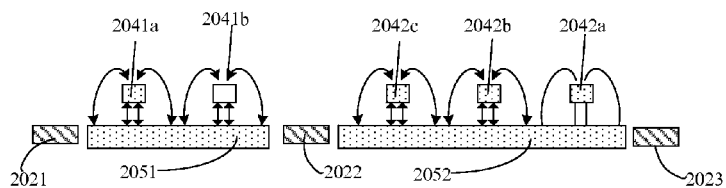
FIG. 13 is a cross-section view of the structure in FIG. 11 along GG'.

A top view of a structure of pixels in a TFT array substrate according to another embodiment of the present invention is shown in FIG. 11 (FIG. 11 only shows a partial structure of two adjacent pixel units), FIG. 12 is a cross-section view of the structure in FIG. 11 along FF', and FIG. 13 is a cross-section view of the structure in FIG. 11 along GG'. It can be seen from FIGS. 11, 12 and 13 that this embodiment is similar to the foregoing embodiment. Similarities between them are not repeated, and differences between them are mainly described. Compared with the foregoing embodiment shown in FIGS. 7, 8, 9 and 10, the difference of the embodiment shown in FIGS. 11, 12 and 13 is that no shielding electrodes are arranged above the data lines 2021, 2022 and 2023, that is, the data lines 2021, 2022 and 2023 are not covered by the shielding electrodes. Accordingly, the common electrode 2041 or 2042 would not extend to the position above the data lines beyond the pixel areas. It should be noted that the data lines 2021, 2022 and 2023 in FIGS. 11, 12 and 13 are all not covered by the shielding electrodes, which however does not limit the present invention. In other embodiments, a part of the data lines 2021, 2022 and 2023 can be covered by the shielding electrodes.

Further referring to FIGS. 11, 12 and 13, it is assumed that the width of each of the strip electrodes 2041a, 2041b, 2041c, 2042a, 2042b and 2042c is a; the minimum distance in the second direction between strip electrodes in adjacent pixel units is b, that is, the minimum distance between the strip electrode 2041b of the first part P1 of the first pixel unit PIX1 and the strip electrode 2042c of the fourth part P4 of the second pixel unit PIX2 is b, the minimum distance between the strip electrode 2042b of the third part P3 of the second pixel unit PIX2 and the strip electrode 2041c of the second part P2 of the first pixel unit PIX1 is b, the minimum distance between the strip electrode of the first pixel unit PIX1 and a strip electrode of a pixel unit (not drawn) on the left of the first pixel unit PIX1 is b, and the minimum distance between the strip electrode of the second pixel unit PIX2 and a strip electrode of a pixel unit (not drawn) on the right of the second pixel unit PIX2 is b; there are slits with a width of c between the strip electrodes in the pixel units PIX1 and PIX2, that is, there are slits with the width of c between 2041a and 2041b, between 2041b and 2041c, between 2042c and 2042b, and between 2042b and 2042a; and the unit group has (2N+1) strip electrodes and (2N−1) slits with the width of c in the second direction, where N is a positive integer; and generally, N is one of 1, 2, 3 and 4. In this case, the width W of the unit group is (2N+1)*a+(2N−1)*c+2b, and the average width of one pixel unit is W'=W/2=(N+0.5)*a+(N−0.5)*c+b. In consideration of the exposure limit of the exposure machine for preparing the TFT array substrate, a, b and c cannot be too small; and in consideration of the transmittance of the TFT array substrate, a, b and c cannot be too large.

By comparing the prior art shown in FIGS. 1 and 2 with the solution according to this embodiment of the present invention, beneficial effects of the embodiment of the present invention will be described below.

It is assumed that a, b and c have minimums $a_{min}$, $b_{min}$ and $c_{min}$ respectively, and maximums $a_{max}$, $b_{max}$ and $c_{max}$ respectively; i.e., $a_{min} \leq a \leq a_{max}$, $b_{min} \leq b \leq b_{max}$, and $c_{min} \leq c \leq c_{max}$.

Figure 1:
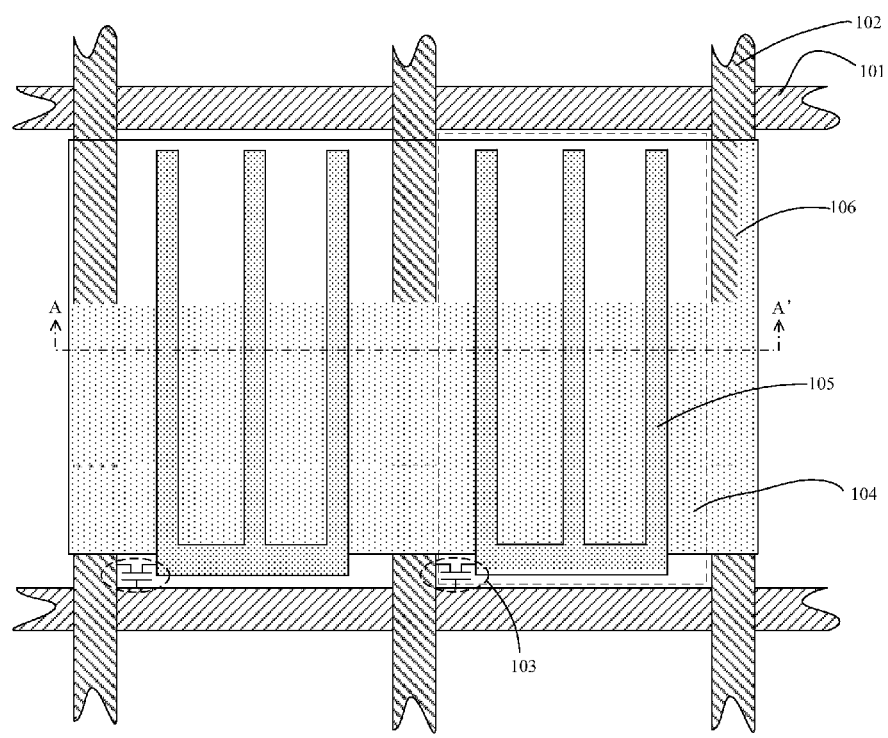
FIG. 1 is a top view of a structure of pixels of an FFS-type liquid crystal display panel in the prior art.
Figure 2:
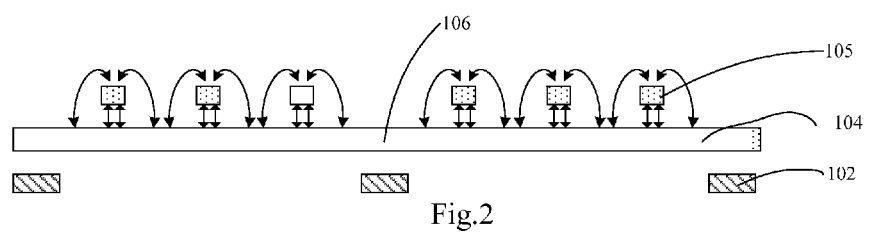
FIG. 2 is a cross-section view of the structure in FIG. 1 along AA'.

According to the prior art shown in FIGS. 1 and 2, if the width of each pixel unit is W'=N*a+(N−1)*c+b, the width W' of each pixel unit satisfies $N*a_{min}+(N-1)*c_{min}+b_{min} \leq W' \leq N*a_{max}+(N-1)*c_{max}+b_{max}$. Since N is a positive integer, the width W' of each pixel unit is limited in the prior art, and pixel units with some widths cannot be realized or are realized with poor effects by using the prior art shown in FIGS. 1 and 2. For example, for a pixel unit with a width W', if the width W' satisfies $N*a_{max}+(N-1)*c_{max}+b_{max}<W'<(N+1)*a_{min}+N*c_{min}+b_{mm}$, the pixel unit can not be realized or is realized with poor effects by using the prior art shown in FIGS. 1 and 2, because if $W'<(N+1)*a_{min}+N*c_{min}+b_{mm}$, (N+1) strip electrodes can not be prepared in the pixel unit under the exposure limit of the exposure machine; and if $N*a_{max}+(N-1)*c_{max}+b_{max}<W'$, N strip electrodes can be arranged in the pixel unit, but the transmittance is too low. On the other hand, the average width of one pixel unit in the embodiment of the present invention is W=(N+0.5)*a+(N−0.5)*c+b and satisfies $(N+0.5)*a_{min}+(N-0.5)*c_{min}+b_{mm} \leq W \leq (N+0.5)*a_{max}+(N-0.5)*c_{max}+b_{max}$. As long as the value range $(N+0.5)*a_{min}+(N-0.5)*c_{min}+b_{min} \leq W \leq (N+0.5)*a_{max}+(N-0.5)*c_{max}+b_{max}$ of the average width W of one pixel unit in the embodiment of the present invention and $N*a_{max}+(N-1)*c_{max}+b_{max}<W'<(N+1)*a_{min}+N*c_{min}+b_{min}$ have an intersection, the pixel units prepared in the embodiment of the present invention can not only meet the exposure limit requirement of the exposure machine, but also have relatively high transmittance.

A specific example is further given below for illustration. Generally, let 2 μm≤a≤3 μm (a preferred value of a is 2.5 μm), 8 μm≤b≤10 μm, and 4 μm≤c≤5 μm (a preferred value of c is 4.5 μm); namely $a_{min}$=2 μm, $b_{min}$=8 μm, $c_{min}$=4 μm, $a_{max}$=3 μm, $b_{max}$=10 μm, and $c_{max}$=5 μm. At this time, the width W' of the pixel unit prepared by using the prior art shown in FIGS. 1 and 2 satisfies 2N μm+4(N−1) μm+8 μm≤W'≤3N μm+5(N−1) μm+10 μm, that is, W' satisfies 10 μm≤W'≤13 μm (N=1) or 16 μm≤W'≤21 μm (N=2) or 22 μm≤W'≤29 μm (N=3). Correspondingly, for the pixel unit of which the width W' satisfies 13 μm<W'<16 μm, 1 strip electrode can merely be arranged in one pixel unit in the prior art shown in FIGS. 1 and 2, and at this time, the transmittance is low. For the pixel unit of which the width W' satisfies 21 μm<W'<22 μm, 2 or 1 strip electrode(s) can merely be arranged in one pixel unit in the prior art shown in FIGS. 1 and 2, while the transmittance is also low. On the other hand, the average width of one pixel unit in the embodiment of the present invention is W=(N+0.5)*a+(N−0.5)*c+b and satisfies 2(N+0.5) μm+4(N−0.5) μm+8 μm≤W≤3(N+0.5) μm+5(N−0.5) μm+10 μm, that is, W satisfies 15 μm≤W≤17 μm (N=1) or 21 μm≤W≤25 μm (N=2). 15 μm≤W≤17 μm (N=1) and 13 μm<W'<16 μm have an intersection 15 μm≤W<16 μm, that is, for the pixel unit of which the width W satisfies 15 μm≤W<16 μm, 1 strip electrode can be arranged in one pixel unit in the embodiment of the present invention, and at this time, the exposure limit requirement of the exposure machine can be met, and relatively high transmittance can also be obtained. Similarly, 21 μm≤W≤25 μm (N=2) and 21 μm<W'<22 μm have an intersection 21 μm<W<22 μm, that is, for the pixel unit of which the width W satisfies 21 μm<W<22 μm, 2 strip electrodes can be arranged in one pixel unit in the embodiment of the present invention, and at this time, the exposure limit requirement of the exposure machine can be met, and relatively high transmittance can also be obtained.

Another Embodiment

Figure 14:
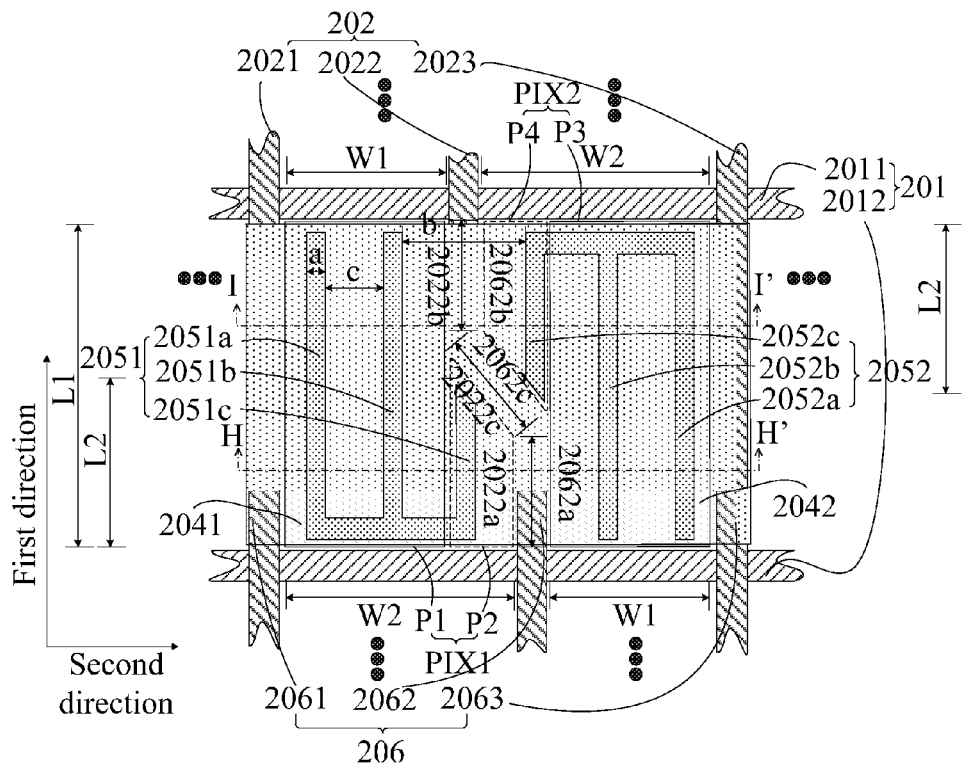
FIG. 14 is a top view of a structure of pixels in a TFT array substrate according to another embodiment of the present invention.
Figure 15:
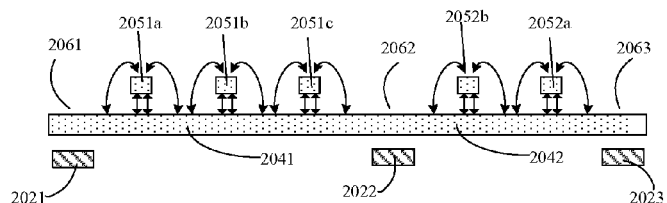
FIG. 15 is a cross-section view of the structure in FIG. 14 along HH'.
Figure 16:
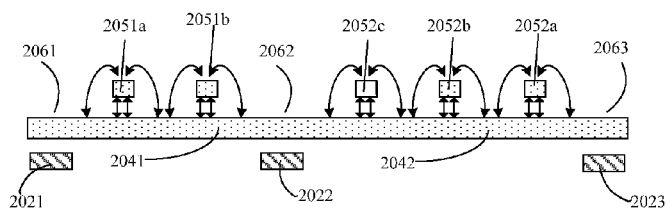
FIG. 16 is a cross-section view of the structure in FIG. 14 along II'.

A top view of a structure of pixels in a TFT array substrate according to another embodiment of the present invention is shown in FIG. 14 (FIG. 14 only shows a partial structure of two adjacent pixel units), FIG. 15 is a cross-section view of the structure in FIG. 14 along HH', and FIG. 16 is a cross-section view of the structure in FIG. 14 along II'. It can be seen from FIGS. 14, 15 and 16 that the embodiment and the foregoing embodiments have similarities and differences. The main difference is that in the embodiment, the pixel electrode is comb-like shape and includes a plurality of strip electrodes; the common electrode is flat shape; and the pixel electrode is located above the common electrode and insulated from the common electrode. The TFT array substrate in the embodiment further includes a shielding electrode, where the shielding electrode is formed by extending the flat shaped common electrode to a position above the data line and covering the data line. The specific description is as follows:

The TFT array substrate according to the embodiment includes:

a plurality of scan lines 201 (two adjacent scan lines 2011 and 2012 are shown in the figure);

a plurality of data lines 202 (three adjacent data lines 2021, 2022 and 2023 are shown in the figure) insulated from and intersecting the plurality of scan lines 201; and pixel units (two adjacent pixel units PIX1 and PIX2 are shown in the figure) located in pixel areas defined by adjacent scan lines and adjacent data lines.

In this case, each of the pixel units includes a first electrode and a second electrode stacked and insulated from each other, the first electrode is flat shape, and the second electrode includes a plurality of strip electrodes extending along a first direction and arranged along a second direction (the first direction intersects the second direction, and is generally perpendicular to or substantially perpendicular to the second direction). Specifically, the pixel unit PIX1 includes a first electrode 2041 and a second electrode 2051 stacked and insulated from each other, the first electrode 2041 is flat shape, and the second electrode 2051 includes a plurality of strip electrodes 2051a, 2051b and 2051c (three strip electrodes as an example in the figure) extending along the first direction and arranged along the second direction; and the pixel unit PIX2 includes a first electrode 2042 and a second electrode 2052 stacked and insulated from each other, the first electrode 2042 is flat shape, and the second electrode 2052 includes a plurality of strip electrodes 2052a, 2052b and 2052c (three strip electrodes as an example in the figure) extending along the first direction and arranged along the second direction.

The adjacent first pixel unit PIX1 and second pixel unit PIX2 form a unit group, and are arranged along the second direction; the first pixel unit PIX1 includes a first part P1 extending along the first direction and a second part P2 extending from an end (a lower end in the figure) area of the first part P1 to the second pixel unit PIX2; the second pixel unit PIX2 includes a third part P3 extending along the first direction and a fourth part P4 extending from an end (an upper end in the figure) area of the third part P3 to the first pixel unit PIX1; and the second part P2 is staggered with the fourth part P4. The first part P1 can be in one of a plurality of shapes, such as in shape of a parallelogram, an epaulet, a rectangle or a square and the like. Generally, the width of the first part P1 along the first direction remains unchanged or substantially unchanged. Taking the rectangular first part P1 as an example in FIG. 14, the length L1 of the first part P1 in the first direction is greater than the width W1 in the second direction. Similarly, the third part P3 can be in one of a plurality of shapes, such as in shape of a parallelogram, an epaulet, a rectangle or a square and the like. Generally, the width of the third part P3 along the first direction remains unchanged or substantially unchanged. Taking the rectangular third part P3 as an example in FIG. 14, the length L1 of the third part P3 in the first direction is greater than the width W1 in the second direction. Preferably, the first part P1 and the third part P3 are the same or substantially same in shape, and are arranged in parallel (both are rectangular as shown in the figure).

In addition, in FIG. 14, the second part P2 extends from the lower end of the first part P1 to the second pixel unit PIX2 along the second direction, so that the width of the lower end (namely the end where the second part P2 is located) of the first pixel unit PIX1 in the width direction (namely the second direction) is W2; and the fourth part P4 extends from the upper end of the third part P3 to the first pixel unit PIX1 along the second direction, so that the width of the upper end (namely the end where the fourth part P4 is located) of the second pixel unit PIX2 in the width direction (namely the second direction) is W2. The upper end and the lower end are two opposite ends of the unit group respectively. The length L2 of the second part P2 in the first direction is smaller than the length L1 of the first part P1 in the first direction; and similarly, the length L2 of the fourth part P4 in the first direction is smaller than the length L1 of the third part P3 in the first direction. The second part P2 and the fourth part P4 extend along the opposite directions and are staggered with each other, so that they are arranged along the first direction.

The first part P1 and the second part P2 form an L shape, the third part P3 and the fourth part P4 form an L shape, and the interior angle of the L shape of the first pixel unit PIX1 and the interior angle of the L shape of the second pixel unit PIX2 are in a diagonal arrangement.

It should be noted that if the first part P1 and the third part P3 are designed to be in different shapes, the unit group formed by the first pixel unit PIX1 and the second pixel unit PIX2 can also be in different shapes, such as in shape of a parallelogram, an epaulet, a rectangle or a square and the like. In FIG. 14, since both the first part P1 and the third part P3 are rectangular, the whole unit group is also rectangular. The length of the unit group along the first direction is L1 (not including the width of the scan line 201), and the width W of the unit group along the second direction is the sum of W1, W2 and the width of the data line 202. In this case, the profile of the first pixel unit PIX1 and the profile of the second pixel unit PIX2 are centrosymmetric.

Preferably, the first pixel unit PIX1 and the second pixel unit PIX2 are equal or substantially equal in size, and are the same or substantially same in area. Further, the storage capacitance of the first pixel unit PIX1 and the storage capacitance of the second pixel unit PIX2 are the same or substantially same is size, or the overlapping area of the first electrode 2041 with the second electrode 2051 of the first pixel unit PIX1 and the overlapping area of the first electrode 2042 with the second electrode 2052 of the second pixel unit PIX2 are the same or substantially same, and in this case, the color resistance compensation is not needed for the first pixel unit PIX1 and the second pixel unit PIX2 during display. In addition, the first pixel unit PIX1 and the second pixel unit PIX2 can also be the same in shape.

It can further be seen from FIGS. 14, 15 and 16 that the second part P2 is provided with one strip electrode 2051c; and the fourth part P4 is provided with one strip electrode 2052c. Each of the first part P1 and the third part P3 includes N strip electrodes, where N is a positive integer. In FIG. 14, N=2 is taken as an example, namely the first part P1 is provided with two strip electrodes 2051a and 2051b, and the third part P3 is provided with two strip electrodes 2052a and 2052b. Generally, N is one of 1, 2, 3 and 4. In this case, the end (namely the lower end) of the unit group corresponding to the second part P2 is provided with (2N+1) strip electrodes, and the end (namely the upper end) of the unit group corresponding to the fourth part P4 is provided with (2N+1) strip electrodes; that is, the unit group has an odd number of strip electrodes in the width direction (second direction).

In addition, in the embodiment, the first electrodes 2041 and 2042 are common electrodes, and the second electrodes 2051 and 2052 are pixel electrodes and are located above the common electrodes 2041 and 2042. The TFT array substrate further includes a shielding electrode 206. The shielding electrode 206 is generally located on the same layer and made of the same material as the common electrodes 2041 and 2042, and generally also has a common potential. In the embodiment, the shielding electrode 206 includes a first shielding electrode 2061 and a third shielding electrode 2063 respectively located above the data lines 2021 and 2023 outside the first pixel unit PIX1 and the second pixel unit PIX2 and insulated from and overlapping with the data lines 2021 and 2023. Generally, the first shielding electrode 2061 covers the data line 2021, and the third shielding electrode 2063 covers the data line 2023. The shielding electrode 206 further includes a second shielding electrode 2062, which is formed by extending the common electrodes 2041 and 2042 to a position above the data line 2022 between the first pixel unit PIX1 and the second pixel unit PIX2 and is insulated from and overlaps with the data line 2022. Generally, the second shielding electrode 2062 covers the data line 2022.

Further referring to FIGS. 14, 15 and 16, it is assumed that the width of each of the strip electrodes 2051a, 2051b, 2051c, 2052a, 2052b and 2052c is a; the minimum distance in the second direction between strip electrodes in adjacent pixel units is b, that is, the minimum distance between the strip electrode 2051b of the first part P1 of the first pixel unit PIX1 and the strip electrode 2052c of the fourth part P4 of the second pixel unit PIX2 is b, the minimum distance between the strip electrode 2052b of the third part P3 of the second pixel unit PIX2 and the strip electrode 2051c of the second part P2 of the first pixel unit PIX1 is b, the minimum distance between the strip electrode of the first pixel unit PIX1 and a strip electrode of a pixel unit (not drawn) on the left of the first pixel unit PIX1 is b, and the minimum distance between the strip electrode of the second pixel unit PIX2 and a strip electrode of a pixel unit (not drawn) on the right of the second pixel unit PIX2 is b; there are slits with a width of c between the strip electrodes in the pixel units PIX1 and PIX2, that is, there are slits with the width of c between 2051a and 2051b, between 2051b and 2051c, between 2052c and 2052b, and between 2052b and 2052a; and the unit group has (2N+1) strip electrodes and (2N−1) slits with the width of c in the second direction; and in this case, the width W of the unit group is $(2N+1)*a+(2N-1)*c+2b$, and the average width of one pixel unit is $W'=W/2=(N+0.5)*a+(N-0.5)*c+b$. In consideration of the exposure limit of the exposure machine for preparing the TFT array substrate, a, b and c cannot be too small; and in consideration of the transmittance of the TFT array substrate, a, b and c cannot be too large.

By comparing the prior art shown in FIGS. 1 and 2 with the solution according to the embodiment of the present invention, beneficial effects of the embodiment of the present invention are described below.

It is assumed that a, b and c have minimums $a_{min}$, $b_{min}$ and $c_{min}$ respectively, and maximums $a_{max}$, $b_{max}$ and $c_{max}$ respectively; i.e., $a_{min} \leq a \leq a_{max}$, $b_{min} \leq b \leq b_{max}$, and $c_{min} \leq c \leq c_{max}$.

According to the prior art shown in FIGS. 1 and 2, if the width of each pixel unit is $W'=N*a+(N-1)*c+b$, the width $W'$ of each pixel unit satisfies $N*a_{min}+(N-1)*c_{min}+b_{min} \leq W' \leq N*a_{max}+(N-1)*c_{max}+b_{max}$. Since N is a positive integer, the width W' of each pixel unit is limited in the prior art, and pixel units with some widths can not be realized or are realized with poor effects by using the prior art shown in FIGS. 1 and 2. For example, for a pixel unit with a width W', if the width W' satisfies $N*a_{max}+(N-1)*c_{max}+b_{max}<W'<(N+1)*a_{min}+N*c_{min}+b_{mm}$, the pixel unit cannot be realized or is realized with poor effects by using the prior art shown in FIGS. 1 and 2, because if $W'<(N+1)*a_{min}+N*c_{min}+b_{mm}$, (N+1) strip electrodes cannot be prepared in the pixel unit under the exposure limit of the exposure machine; and if $N*a_{max}+(N-1)*c_{max}+b_{max}<W'$, N strip electrodes can be arranged in the pixel unit, but the transmittance is too low. On the other hand, the average width of one pixel unit in the embodiment of the present invention is $W=(N+0.5)*a+(N-0.5)*c+b$ and satisfies $(N+0.5)*a_{min}+(N-0.5)*c_{min}+b_{mm} \leq W \leq (N+0.5)*a_{max}+(N-0.5)*c_{max}+b_{max}$. As long as the value range $(N+0.5)*a_{min}+(N-0.5)*c_{min}+b_{min} \leq W \leq (N+0.5)*a_{max}+(N-0.5)*c_{max}+b_{max}$ of the average width W of one pixel unit in the embodiment of the present invention and $N*a_{max}+(N-1)*c_{max}+b_{max}<W'<(N+1)*a_{min}+N*c_{min}+b_{min}$ have an intersection, the pixel units prepared in the embodiment of the present invention can not only meet the exposure limit requirement of the exposure machine, but also have relatively high transmittance.

A specific example is further given below for illustration. Generally, let 2 μm≤a≤3 μm (a preferred value of a is 2.5 μm), 8 μm≤b≤10 μm, and 4 μm≤c≤5 μm (a preferred value of c is 4.5 μm); namely $a_{min}$=2 μm, $b_{min}$=8 μm, $c_{min}$=4 μm, $a_{max}$=3 μm, $b_{max}$=10 μm, and $c_{max}$=5 μm. At this time, the width W' of the pixel unit prepared by using the prior art shown in FIGS. 1 and 2 satisfies 2N μm+4(N−1) μm+8 μm≤W'≤3N μm+5(N−1) μm+10 μm, that is, W' satisfies 10 μm≤W'≤13 μm (N=1) or 16 μm≤W'≤21 μm (N=2) or 22 μm≤W'≤29 μm (N=3). Correspondingly, for the pixel unit of which the width W' satisfies 13 μm<W'<16 μm, 1 strip electrode can merely be arranged in one pixel unit in the prior art shown in FIGS. 1 and 2, and at this time, the transmittance is low. For the pixel unit of which the width W' satisfies 21 μm<W'<22 μm, 2 or 1 strip electrode(s) can merely be arranged in one pixel unit in the prior art shown in FIGS. 1 and 2, while the transmittance is also low. On the other hand, the average width of one pixel unit in the embodiment of the present invention is $W=(N+0.5)*a+(N−0.5)*c+b$ and satisfies 2(N+0.5) μm+4(N−0.5) μm+8 μm≤W≤3(N+0.5) μm+5(N−0.5) μm+10 μm, that is, W satisfies 15 μm≤W≤17 μm (N=1) or 21 μm≤W≤25 μm (N=2). 15 μm≤W≤17 μm (N=1) and 13 μm<W'<16 μm have an intersection 15 μm≤W<16 μm, that is, for the pixel unit of which the width W satisfies 15 μm≤W<16 μm, 1 strip electrode can be arranged in one pixel unit in the embodiment of the present invention, and at this time, the exposure limit requirement of the exposure machine can be met, and relatively high transmittance can also be obtained. Similarly, 21 μm≤W≤25 μm (N=2) and 21 μm<W'<22 μm have an intersection 21 μm<W<22 μm, that is, for the pixel unit of which the width W satisfies 21 μm<W<22 μm, 2 strip electrodes can be arranged in one pixel unit in the embodiment of the present invention, and at this time, the exposure limit requirement of the exposure machine can be met, and relatively high transmittance can also be obtained.

Another Embodiment

Figure 17:
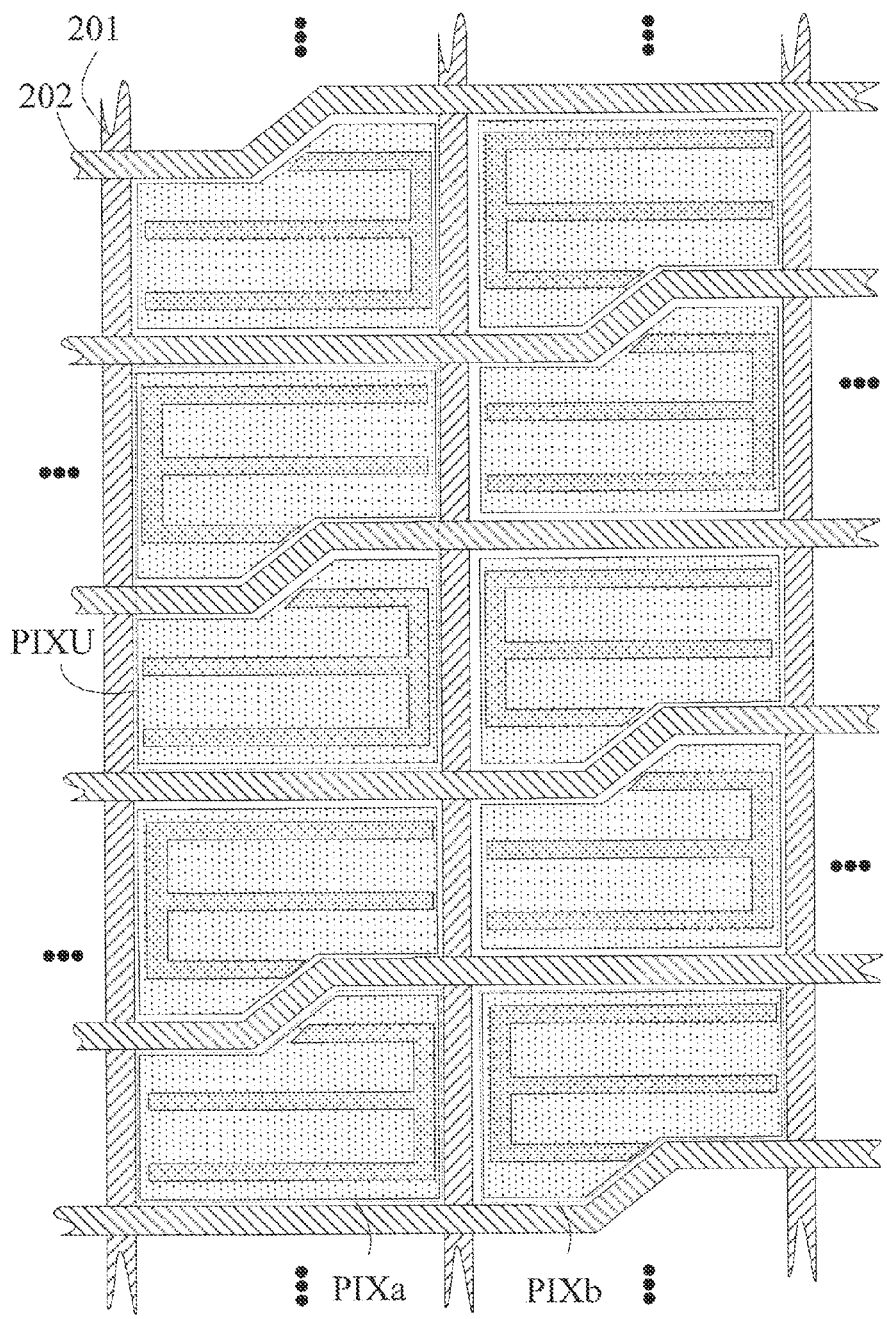
FIG. 17 is a top view of a structure of pixels in a TFT array substrate according to another embodiment of the present invention.

A top view of a structure of pixels in a TFT array substrate according to another embodiment of the present invention is shown in FIG. 17. As shown in FIG. 17, the TFT array substrate comprises a plurality of pixel units PIXU. In addition, profiles (as shown by dashed boxes in two pixel units) of adjacent pixel units PIXa and PIXb in the same column in the TFT array substrate are centrosymmetric. Certainly, in other embodiments, profiles of adjacent pixel units in the same row in the TFT array substrate can also be centrosymmetric.

In addition, it should be noted that examples with the extending directions of the strip electrodes being the same as those of the data lines are given for illustration in the above four foregoing embodiments, but in other embodiments, the extending directions of the strip electrodes can also be the same as those of the scan lines, which is not described redundantly herein.

Another Embodiment

Figure 18:
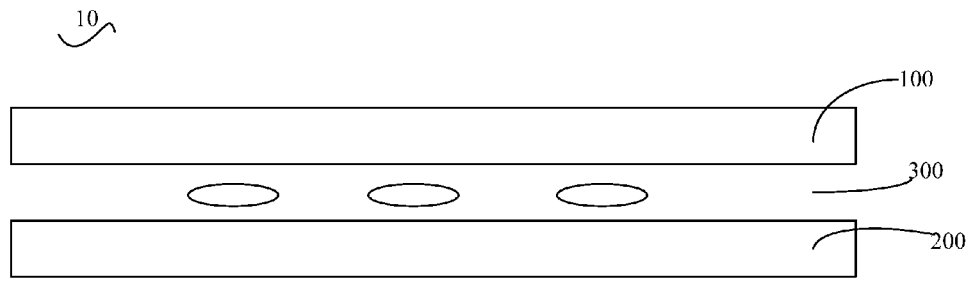
FIG. 18 is a schematic diagram of a structure of a display panel according to another embodiment.

A display panel 10 according to another embodiment of the present invention is shown in FIG. 18. The display panel includes a color film substrate 100 and a TFT array substrate 200 arranged opposite each other, and a liquid crystal layer 300 arranged between the color film substrate 100 and the TFT array substrate 200. The TFT array substrate 200 can be the one described in any one of the above four foregoing embodiments.

Another Embodiment

Figure 19:
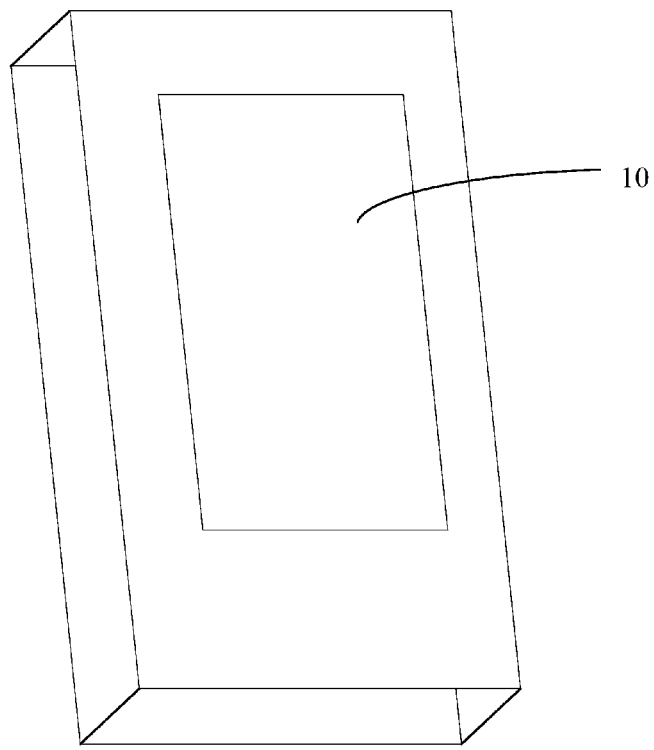
FIG. 19 is a schematic diagram of a structure of a display device according to another embodiment.

A display device according to another embodiment of the present invention is shown in FIG. 19. The display device includes the display panel 10 described in the foregoing embodiment.

It should be noted that the pixel unit in the above-mentioned embodiments further includes a TFT (thin film transistor) serving as a pixel switch, which is the common knowledge and thus not described in the above-mentioned embodiments and the accompanying drawings.

Evidently those skilled in the art can make various modifications and variations to the invention without departing from the spirit and scope of the invention. Thus the invention is also intended to encompass these modifications and variations thereto so long as these modifications and variations come into the scope of the claims appended to the invention and their equivalents.

What is claimed is:

1. A TFT array substrate, comprising:
    a plurality of scan lines; a plurality of data lines insulated from and intersecting the plurality of scan lines; pixel units located in pixel areas defined by adjacent scan lines and adjacent data lines; wherein each of the pixel units comprises: a first electrode and a second electrode stacked and insulated from each other, wherein the first electrode is flat shape, and the second electrode comprises a plurality of strip electrodes extending along a first direction and arranged along a second direction; and a first pixel unit and a second pixel unit adjacent to each other form a unit group, wherein the first pixel unit comprises a first part extending along the first direction and a second part extending from an end area of the first part to the second pixel unit; the second pixel unit comprises a third part extending along the first direction and a fourth part extending from an end area of the third part to the first pixel unit; and the second part is staggered with the fourth part.

2. The TFT array substrate according to claim 1, wherein one of the strip electrodes is arranged in the second part; and one of the strip electrodes is arranged in the fourth part.

3. The TFT array substrate according to claim 2, wherein each of the first part and the third part comprises N strip electrodes, an end of the unit group corresponding to the second part is provided with (2N+1) strip electrodes, and an end of the unit group corresponding to the fourth part is provided with (2N+1) strip electrodes, wherein N is a natural number larger than or equal to 0.

4. The TFT array substrate according to claim 3, wherein N is one of 0, 1, 2, 3 and 4.

5. The TFT array substrate according to claim 3, wherein the first electrode is a pixel electrode, the second electrode is a common electrode and is located above the pixel electrode, and the TFT array substrate further comprises a shielding electrode, wherein the shielding electrode is formed by extending the strip electrode of the common electrode to a position above the data line, and is insulated from and overlaps with the data lin.

6. The TFT array substrate according to claim 5, wherein the shielding electrode comprises a part formed by extending the strip electrode of the second part and/or the strip electrode of the fourth part to the position above the data line between the first pixel unit and the second pixel unit.

7. The TFT array substrate according to claim 6, wherein the data line between the first pixel unit and the second pixel unit comprises a first section between the second part and the third part, a second section between the fourth part and the first part, and a third section between the second part and the fourth part; wherein the third section is located between the first section and the second section and connected with the first section and the second section.

8. The TFT array substrate according to claim 7, wherein the strip electrode of the fourth part extends to a position above the first section along the first direction, and the strip electrode of the second part extends to a position above the second section along the first direction.

9. The TFT array substrate according to claim 5, wherein a width of each of the strip electrodes is a; a width of the shielding electrode is b; there are slits with a width of c between adjacent strip electrodes and between adjacent strip electrodes and shielding electrodes; and the unit group has (2N+1) strip electrodes, 2 shielding electrodes and (2N+3) slits in the second direction; wherein 2 µm≤a≤3 µm, 8.5 µm≤b≤9.5 µm, and 4 µm≤c≤5 µm.

10. The TFT array substrate according to claim 3, wherein the first electrode is a common electrode, the second electrode is a pixel electrode and is located above the common electrode, and the TFT array substrate further comprises a shielding electrode, wherein the shielding electrode is formed by extending the flat shape common electrode to a position above the data line, and is insulated from and overlaps with the data line.

11. The TFT array substrate according to claim 10, wherein a width of each of the strip electrodes is a; there are slits with a width of c between the strip electrodes in the pixel units; a minimum distance in the second direction between strip electrodes in adjacent pixel units is b; and the unit group has (2N+1) strip electrodes and (2N−1) slits in the second direction; wherein 2 µm≤a≤3 µm, 8 µm≤b≤10 µm, 4 µm≤c≤5 µm, and N is a positive integer.

12. The TFT array substrate according to claim 1, wherein the first pixel unit is the same as the second pixel unit in area; and/or
    the first pixel unit is the same as the second pixel unit in shape.

13. The TFT array substrate according to claim 12, wherein a storage capacitance of the first pixel unit is the same as a storage capacitance of the second pixel unit in size.

14. The TFT array substrate according to claim 12, wherein profile of the first pixel unit and profile of the second pixel unit are centrosymmetric.

15. The TFT array substrate according to claim 1, wherein widths of the first part and the third part along the second direction are the same, and a sum of widths of the first part and the second part along the second direction is the same as a sum of widths of the third part and the fourth part along the second direction.

16. The TFT array substrate according to claim 15, wherein each unit group is in a shape of a rectangle or a parallelogram or an epaulet.

17. The TFT array substrate according to claim 1, wherein the first part and the second part form an L shape, and the third part and the fourth part form an L shape.

18. The TFT array substrate according to claim 1, wherein profiles of adjacent pixel units located in a same column or a same row in the TFT array substrate are centrosymmetric.

19. A display panel, comprising a color film substrate and the TFT array substrate of claim 1 arranged opposite each other.

20. A display device, comprising the display panel of claim 19.

* * * * *